US011688923B2

(12) United States Patent
Ozkar

(10) Patent No.: US 11,688,923 B2
(45) Date of Patent: Jun. 27, 2023

(54) LTE ANTENNA OPTIMIZED FOR NORTH AMERICAN ELECTRICITY METERS

(71) Applicant: Honeywell International Inc., Morris Plains, NJ (US)

(72) Inventor: Mete Ozkar, Raleigh, NC (US)

(73) Assignee: HONEYWELL INTERNATIONAL INC., Charlotte, NC (US)

(*) Notice: Subject to any disclaimer, the term of this patent is extended or adjusted under 35 U.S.C. 154(b) by 245 days.

(21) Appl. No.: 17/247,232

(22) Filed: Dec. 4, 2020

(65) Prior Publication Data
US 2022/0181764 A1   Jun. 9, 2022

(51) Int. Cl.
*H01Q 1/12* (2006.01)
*H01Q 1/52* (2006.01)
*H01Q 1/36* (2006.01)
*G01R 21/00* (2006.01)

(52) U.S. Cl.
CPC ............... *H01Q 1/12* (2013.01); *G01R 21/00* (2013.01); *G01R 21/007* (2013.01); *H01Q 1/36* (2013.01); *H01Q 1/52* (2013.01)

(58) Field of Classification Search
CPC ... H01Q 1/12; H01Q 1/36; H01Q 1/52; G01R 21/007; G01R 21/00
USPC .......................................................... 343/879
See application file for complete search history.

(56) References Cited

U.S. PATENT DOCUMENTS

| | | | |
|---|---|---|---|
| 5,153,600 A | * | 10/1992 | Metzler ..................... H01Q 5/40 343/846 |
| 6,152,764 A | | 11/2000 | Robinson et al. |
| 6,766,698 B1 | | 7/2004 | Robinson et al. |
| 9,506,960 B2 | | 11/2016 | Tseng et al. |
| 9,615,150 B2 | | 4/2017 | Kashiwagi et al. |
| 9,714,965 B2 | | 7/2017 | Crittenden |
| 10,753,810 B2 | | 8/2020 | Mastrogiacomo et al. |
| 2004/0130843 A1 | | 7/2004 | Tsutsui et al. |
| 2006/0044203 A1 | * | 3/2006 | Shirasaka ................ H01Q 1/42 343/810 |
| 2006/0254356 A1 | * | 11/2006 | Liu ........................ G01S 13/755 73/592 |

(Continued)

FOREIGN PATENT DOCUMENTS

CN     111774318 A     10/2020
EP     1750368 A1      2/2007
(Continued)

OTHER PUBLICATIONS

Philips Magnetic Products, "Cable Shielding", Philips Components, Document order No. 9398 237 28011, Date of release: Feb. 1997, Philips Electronics N.V. 1998 (27 pages total).

(Continued)

*Primary Examiner* — Hai V Tran
(74) *Attorney, Agent, or Firm* — John Maldjian; Stevens & Lee PC

(57) ABSTRACT

One embodiment is an LTE antenna optimized for North American Electricity meters. In one example, the carrier assembly component is a device comprising a carrier having first and second asymmetrical voids on a surface; a backer on a first side of the surface of the carrier; and first, second, third, and fourth structures on a second side of the carrier connected to the backer via the asymmetrical voids.

20 Claims, 8 Drawing Sheets

(56) References Cited

U.S. PATENT DOCUMENTS

| | | | | |
|---|---|---|---|---|
| 2007/0210969 A1* | 9/2007 | Vance | ............... | H01Q 5/371 |
| | | | | 343/702 |
| 2010/0164825 A1* | 7/2010 | Lee | ............... | H01Q 1/38 |
| | | | | 343/822 |
| 2011/0063172 A1* | 3/2011 | Podduturi | ............... | H01Q 5/371 |
| | | | | 343/700 MS |
| 2012/0060606 A1 | 3/2012 | Lakich et al. | | |
| 2013/0002510 A1* | 1/2013 | Azulay | ............... | H01Q 1/243 |
| | | | | 343/893 |
| 2013/0241798 A1* | 9/2013 | Lee | ............... | H01Q 1/50 |
| | | | | 343/876 |
| 2013/0289788 A1 | 10/2013 | Gupta et al. | | |
| 2014/0157907 A1 | 6/2014 | Johnson et al. | | |
| 2014/0306846 A1* | 10/2014 | Nakatsu | ............... | H01Q 21/29 |
| | | | | 343/700 MS |
| 2016/0209464 A1 | 7/2016 | Crittenden | | |

FOREIGN PATENT DOCUMENTS

| | | | |
|---|---|---|---|
| KR | 20080067914 A | 7/2008 | |
| KR | 101364941 B1 | 2/2014 | |

OTHER PUBLICATIONS

Parker, Carole U., "Using Ferrites to Suppress EMI" Jul. 1, 2011, Retrieved from: https://incompliancemag.com/article/using-ferrites-to-suppress-emi/ Retrieved on: Mar. 31, 2021 (43 pages total).

Itron, LTE Exernal Antenna, Specifications; retrieved from https://www.itron.eom/-/media/feature/products/documents/spec-sheet/101461sp01-lte-external-antenna_web.pdf Retrieved on: Apr. 30, 2020 (2 pages total).

PulseLarsen Antennas: Smart Meetering, Retrieved from: https://pulselarsenantennas.com/wp-content/uploads/2017/05/PulseLarsen_SmartMeter_Flyer_2017.pdf Retrieved on: Apr. 30, 2020 (11 pages total).

Powergrid International, Metering, Smart Grid, Issue 12 and vol. 19, "Preventing Electric Meter Fires: Two Perspectives", Dec. 15, 2014 (16 pages total).

Brooks Utility Products, A Tyden Group Company "Portable Meter Socket Jaw Tester", 2020, Retrieved from: http://www.brooksutility.com/products/122, Retrieved on: Nov. 4, 2020 (2 pages total).

\* cited by examiner

US 11,688,923 B2

LTE ANTENNA OPTIMIZED FOR NORTH AMERICAN ELECTRICITY METERS

BACKGROUND

Electric power meters need LTE antennas, but to use an LTE antenna in an electric power meter requires several things of the LTE antenna, ideally. It should allow for multiple LTE bands. For example, in North America, LTE antennas in an electric power meter need to cover 5 cellular bands if there are high data requirements. Second, the LTE antenna should be internal to the electric power meter (not visible), without needing to grow the size of the electric power meter. Third, the LTE antenna should be a balanced antenna, such that it can operate effectively in a noisy electrical environment and a varying mechanical environment. Fourth, the LTE antenna should have diversity, such that it can counter a noisy meter environment, and yet still extend coverage range. Fifth, the LTE antenna should be efficient, such that it passes cellular carrier requirements with regard to radiation. Sixth, the LTE antenna should be isolated from other antennas in the electric power meter.

SUMMARY OF THE INVENTION

Figure 1:
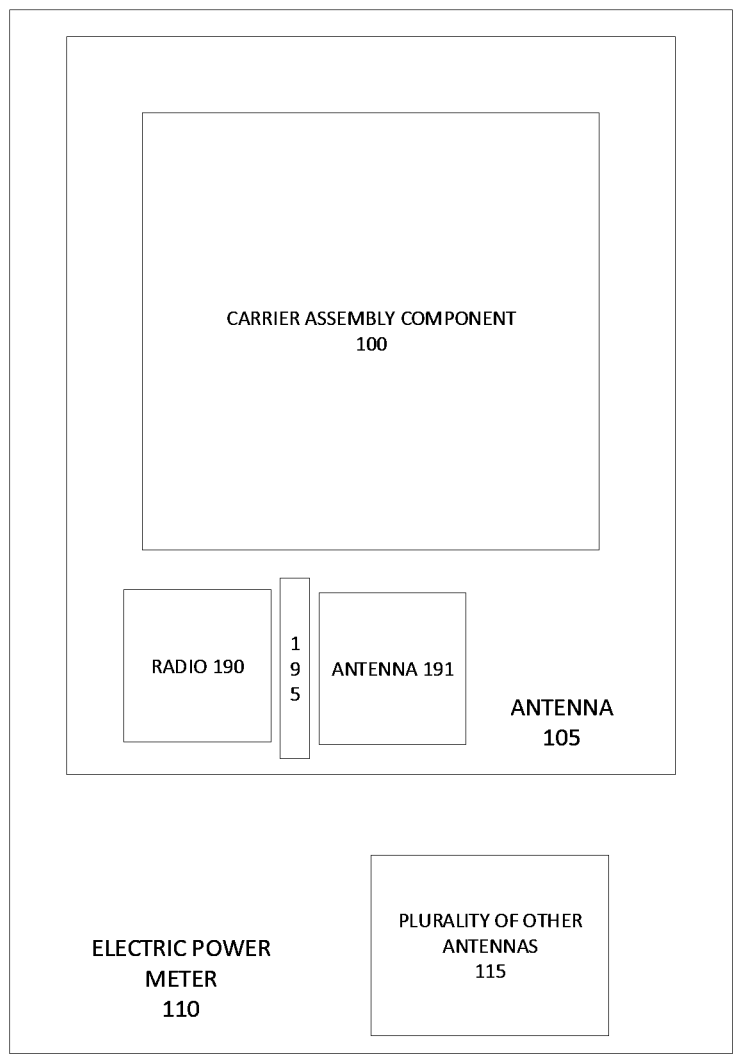
FIG. 1 is an electric power meter that includes an LTE antenna optimized for North American Electricity meters.

One embodiment is an LTE antenna optimized for North American Electricity meters. In one example, a carrier assembly component is a part of the antenna and comprises a carrier having first and second asymmetrical voids on a surface; a backer on a first side of the surface of the carrier; and first, second, third, and fourth structures on a second side of the carrier connected to the backer via the asymmetrical voids. The first and second structures have a connection to the backer via the first asymmetrical void. The third and fourth structures have a connection to the backer via the second asymmetrical void.

In another embodiment, one or more hardware-based non-transitory memory devices storing computer-readable instructions which, when executed by the one or more processors disposed in a computing device, cause the computing device to obtain a carrier having first and second asymmetrical voids on a surface, attach a backer on a first side of the surface of the carrier, attach a first and a second structure on a second side of the carrier, the first and second structures having a first connection to the backer via the first asymmetrical void, the first structure having a plurality of substantially parallel first horizontal ridges and first and second non-parallel vertical ridges, the second structure having a plurality of substantially parallel second horizontal ridges and third and fourth non-parallel vertical ridges, and attach a third and a fourth structure on a second side of the carrier, the third and fourth structures having a second connection to the backer via the second asymmetrical void, the third structure having a plurality of substantially parallel third horizontal ridges and a plurality of third vertical ridges, wherein at least one of the third vertical ridges has a first separation from one of the substantially parallel third horizontal ridges, the fourth structure having a plurality of substantially parallel fourth horizontal ridges and a plurality of fourth vertical ridges, wherein at least one of the fourth vertical ridges has a second separation from one of the substantially parallel fourth horizontal ridges.

Another embodiment is an electric power meter which has at least a first antenna module a plurality of second antennas. The first antenna module includes an isolation component, a carrier assembly component, a radio, and an additional antenna, and wherein the isolation component isolates the carrier assembly component, the radio, and the additional antenna from each other, and wherein the carrier assembly component comprises a carrier having first and second asymmetrical voids on a surface, a backer on a first side of the surface of the carrier, a first and a second structure on a second side of the carrier, the first and second structures having a first connection to the backer via the first asymmetrical void, and a third and a fourth structure on a second side of the carrier, the third and fourth structures having a second connection to the backer via the second asymmetrical void.

DETAILED DESCRIPTION OF THE INVENTION

FIG. 1 illustrates an electric power meter 110 that includes an LTE antenna 105 optimized for North American Electricity meters according to this disclosure. The antenna 105 can be, for example, an LTE or other antenna. The antenna 105 is a component of the electric power meter 110 and includes a carrier assembly component 100. Electric power meter 110 also includes a plurality of other antennas 115. The plurality of other antennas 115 could be, for example an internal ISM-900 mesh-radio antenna and a 2.4 GHz antenna. The plurality of other antennas 115 could also be any antennas suitable for the purpose needed by the electric power meter 110. The plurality of other antennas 115 can include at least 4 additional antennas, so the electric power meter 110 covers at least 5 cellular bands when there are high data requirements. The LTE antenna 105 is also internal (not visible) to the electric power meter 110. In one example, the LTE antenna 105 has an internal radio 190, such as an ISM-900 mesh-radio, and an antenna 191, such as a 2.4 GHz antenna. Radio 190 and antenna 191 are isolated from the LTE antenna 105 via isolation mechanism 195.

Figure 2:
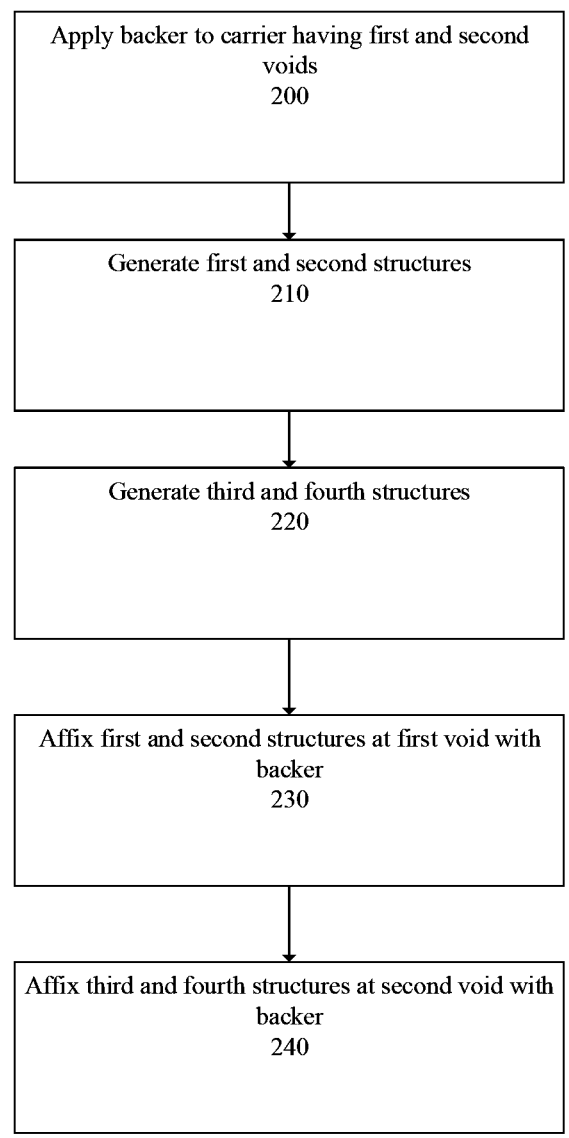
FIG. 2 is a flowchart that illustrates the making of the an LTE antenna optimized for North American Electricity meters.

FIG. 2 is a flowchart that illustrates the making of an LTE antenna optimized for North American Electricity meters. At step 200, a backer is applied to a carrier. The carrier has at least a first and second void area on its surface and has a generally curved structure, in one embodiment. At step 210, first and second structures are generated. At step 220, third and fourth structures are generated. The first through fourth structures are described in further details below. In one embodiment, they have the properties of shielding, isolating, protecting, or otherwise protect any electronic devices associated with the carrier assembly.

At step 230, the first and second structures are affixed to the carrier via the first void. In one example, the first void is in the area of an edge of the carrier and the backer is on a first side. The first and second structures are applied to a second side of the carrier and contact the backer via connection points on the first and second structures where they overlap the first void. At step 240, the third and fourth structures are affixed to the carrier via the second void. In one example, the second void is in the area of an edge of the carrier opposing the first void and the backer is on a first side. The third and fourth structures are applied to a second side of the carrier and contact the backer via connection points on the third and fourth structures where they overlap the second void.

Figure 3:
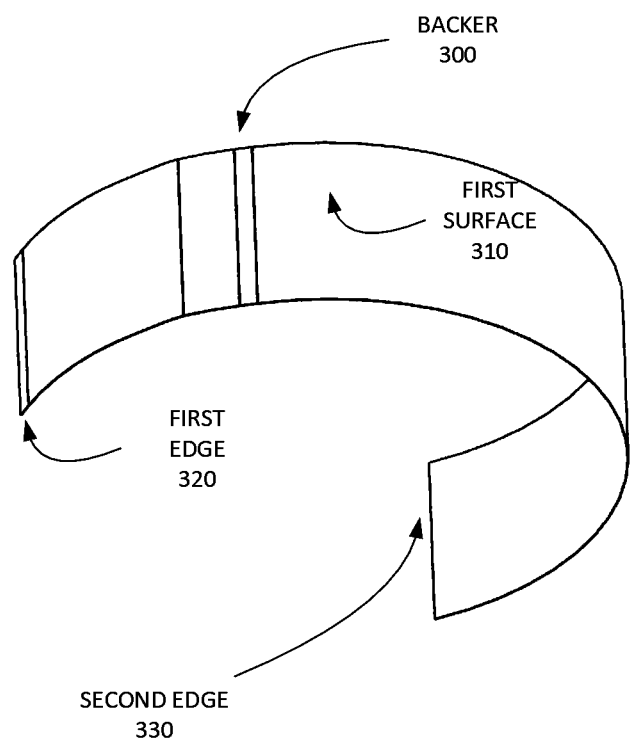
FIG. 3 is a diagram of a backer component.

FIG. 3 is a diagram of a backer component 300. The backer component has a first surface 310 that is capable of coming into contact with another surface and being affixed to the other surface. The backer 300 is generally curved and has a first edge 320 and a second edge 330. In one embodiment, the first edge 320 and the second edge 330 can be aligned with the edges of additional components, such as a carrier, and can generally have a similar shape and surface area such that the backer 300 can cover a portion of the surface of the carrier, or other component, that it is affixed to.

Figure 4:
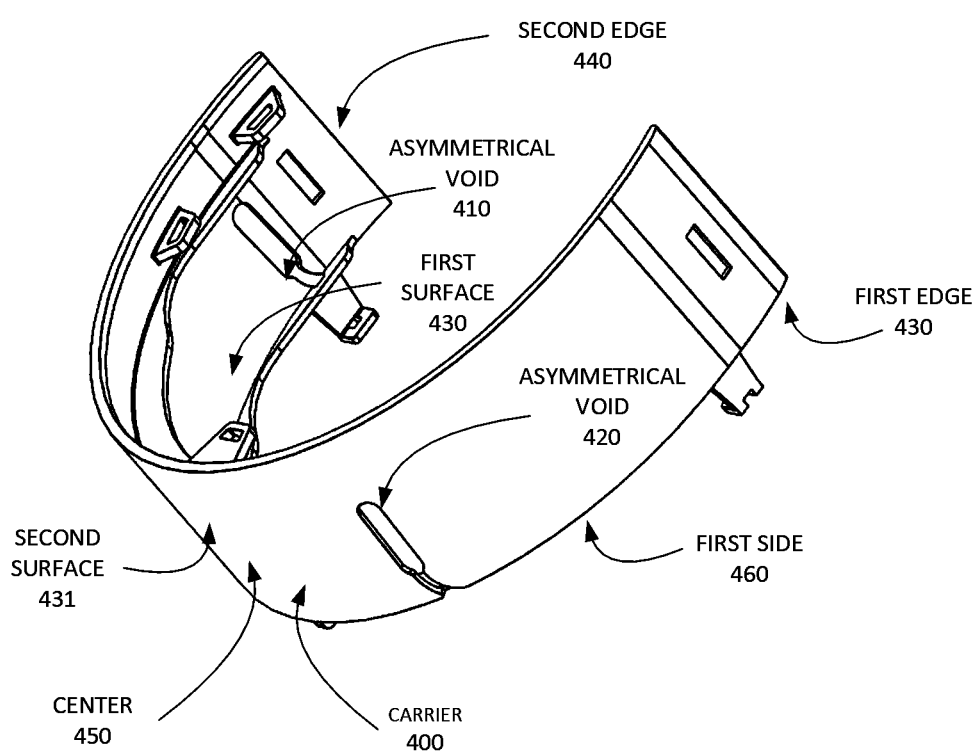
FIG. 4 is a diagram of a carrier component.

One such component is a carrier 400, which is shown with respect to FIG. 4. FIG. 4 is a diagram of the carrier component 400. The carrier component 400 includes asymmetrical voids 410 and 420. The asymmetrical voids 410 and 420 are shown here as elongated and generally oval in shape, although other shapes are possible as well. In this embodiment, the asymmetrical voids 410 and 420 extend to a first side 460 of the carrier, but do not extend to the opposing side of the carrier 400. The carrier 400 includes a first edge 430 and a second edge 440. In the current embodiment, asymmetrical void 410 is closer to the second edge 440 than asymmetrical void 420 is to the first edge 430. Likewise, asymmetrical void 410 is farther away from a center 450 of the carrier 400, than asymmetrical void 410 is from the center 450. Carrier 400 has a first surface 430. The first surface 430 is configured to come into contact with the first surface 310 of FIG. 3 when affixed, connected, or otherwise coupled to a backer.

Figure 5:
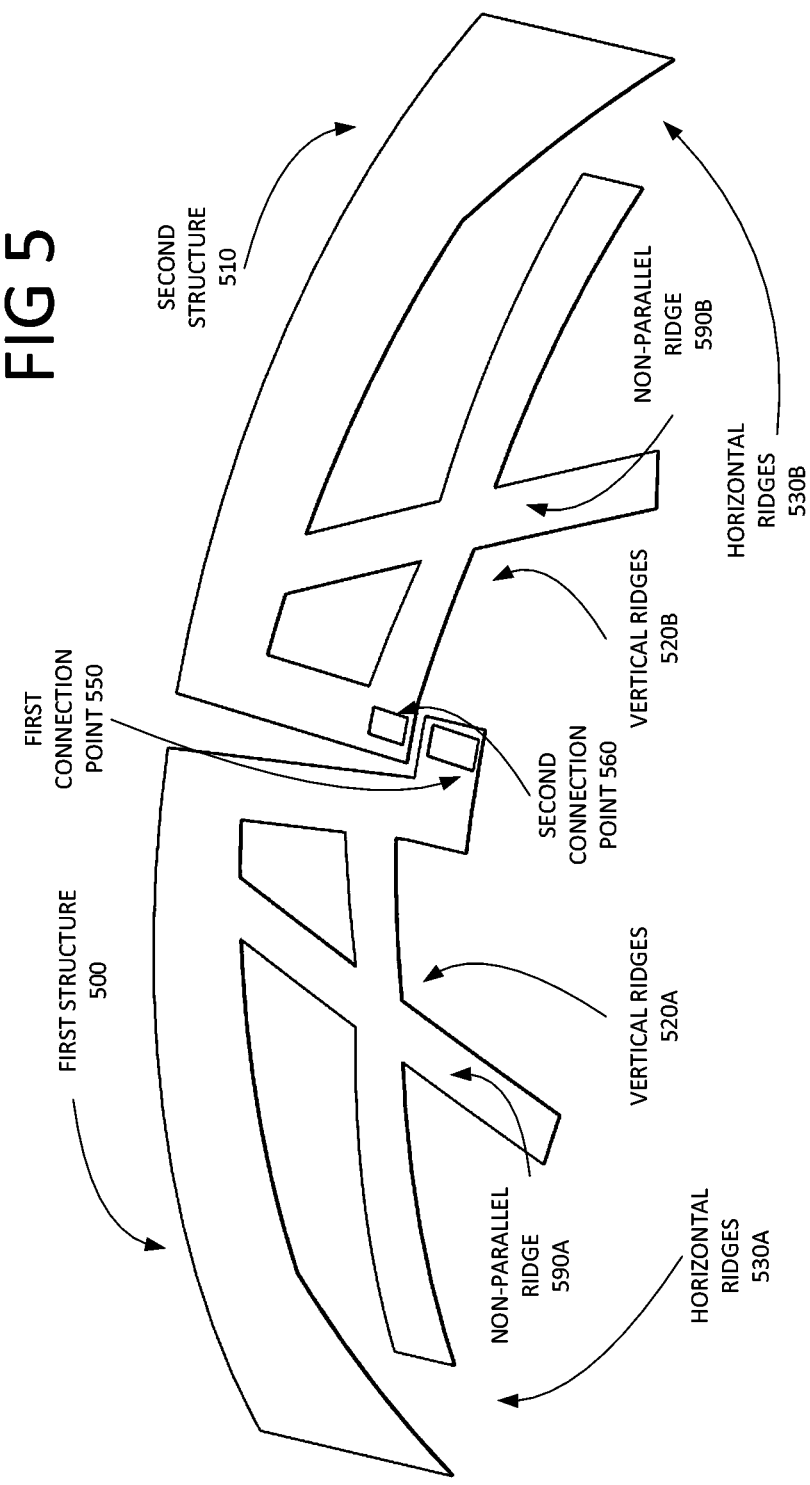
FIG. 5 is a diagram of a first set of structures for the LTE antenna optimized for North American Electricity meters.

FIG. 5 is a diagram of a first set of structures for the LTE antenna optimized for North American Electricity meters. FIG. 5 includes a first structure 500 and a second structure 510. The first and second structures 500 and 510 can be a metal, for example, although other materials can be used as well. The first and second structures 500 and 510 are configured by their position and their geometry to be radiating elements that have conductive properties that enable operation of the antenna. The first structure 500 is configured to be placed on a surface of a carrier. In one embodiment, this includes being placed on the second surface 431 of the carrier 400. The first structure 500 has a first connection to a backer to connect it to the carrier 400. The backer can be, for example, backer 300 of FIG. 3. In FIG. 5, the connection to the first structure 500 is via an asymmetrical void at a first connection point 550. The first structure 500 has a plurality of substantially parallel first horizontal ridges 530A extending away from the void toward an edge of the carrier 400. The first structure 500 further includes a plurality of first vertical ridges 520A, at least one of the first vertical ridges 590A being substantially non-parallel.

The second structure 510 is configured to be placed on a surface of a carrier. In one embodiment, this includes being placed on the second surface 431 of the carrier 400. The second structure 510 has a second connection to a backer to connect it to the carrier 400. The backer can be, for example, backer 300 of FIG. 3. In FIG. 5, the connection to the second structure 510 is via an asymmetrical void at a second connection point 560. The second structure 510 has a plurality of substantially parallel second horizontal ridges 530B extending away from the void toward an edge of the carrier 400. The second structure 510 further includes a plurality of second vertical ridges 520B, at least one of the second vertical ridges 590B being substantially non-parallel.

Figure 6:
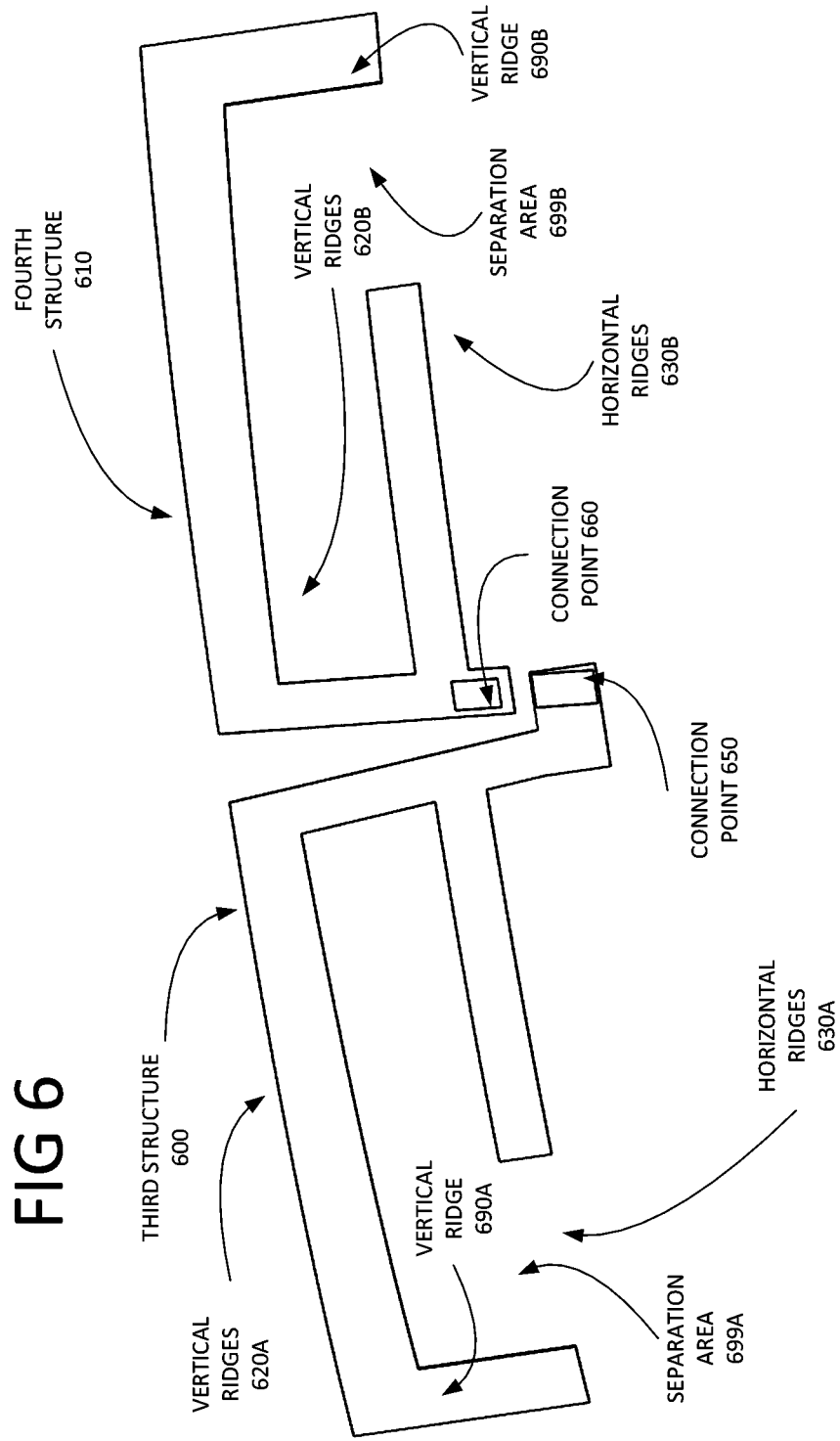
FIG. 6 is a diagram of a second set of structures for the LTE antenna optimized for North American Electricity meters.

FIG. 6 is a diagram of a second set of structures for the LTE antenna optimized for North American Electricity meters. FIG. 6 includes a third structure 600 and a fourth structure 610. The third and fourth structures 600 and 610 can be a metal, for example, although other materials can be used as well. The third and fourth structures 600 and 610 are configured by their position and their geometry to be radiating elements that have conductive properties that enable operation of the antenna. The third structure 600 is configured to be placed on a surface of a carrier. In one embodiment, this includes being placed on the second surface 431 of the carrier 400. The third structure 600 has a third connection to a backer to connect it to the carrier 400. The backer can be, for example, backer 300 of FIG. 3. In FIG. 6, the connection to the third structure 600 is via an asymmetrical void at a third connection point 650. The third structure 600 further includes a plurality of substantially parallel third horizontal ridges 630A extending away from the asymmetrical void toward an edge of the carrier 400 and a plurality of third vertical ridges 620A, wherein at least one of the third vertical ridges 690A has a separation area 699A from one of the substantially parallel third horizontal ridges 630A.

The fourth structure 610 is configured to be placed on a surface of a carrier. In one embodiment, this includes being placed on the second surface 431 of the carrier 400. The fourth structure 610 has a fourth connection to a backer to connect it to the carrier 400. The backer can be, for example, backer 300 of FIG. 3. In FIG. 6, the connection to the fourth structure 610 is via an asymmetrical void at a fourth connection point 660. The fourth structure 610 further includes a plurality of substantially parallel fourth horizontal ridges 630B extending away from the asymmetrical void toward a center of the carrier 400 and a plurality of fourth vertical ridges 620B, wherein at least one of the fourth vertical ridges 690B has a separation area 699B from one of the substantially parallel fourth horizontal ridges 630B.

Figure 7:
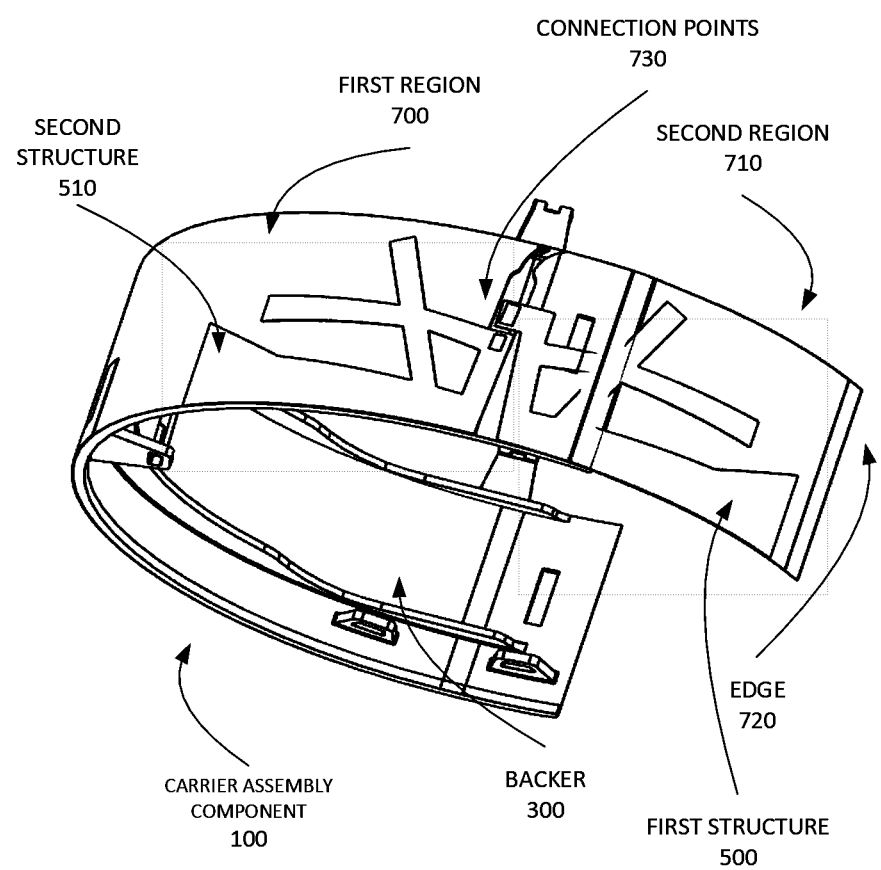
FIG. 7 is a diagram illustrating first and second regions of the LTE antenna optimized for North American Electricity meters.

FIG. 7 is a diagram illustrating first and second regions of the LTE antenna optimized for North American Electricity meters. In one embodiment, FIG. 7 represents the constructed carrier assembly component 100 from a side view where a first region 700 and a second region 710 are visible. In the embodiment of FIG. 7, the second structure 510 is in the first region 700 and the first structure 500 is in the second region 710. The first and second structures 500 and 510 contact a void region at connection points 730. In this example, each of the first and the second structures 500 and 510 are shown as having individual connection points 730 that contact the backer 300 via the void region, although other implementations are possible as well. In the current example, the second region 710 is shown as being adjacent and or near to an edge 720 of the carrier assembly component 100.

Figure 8:
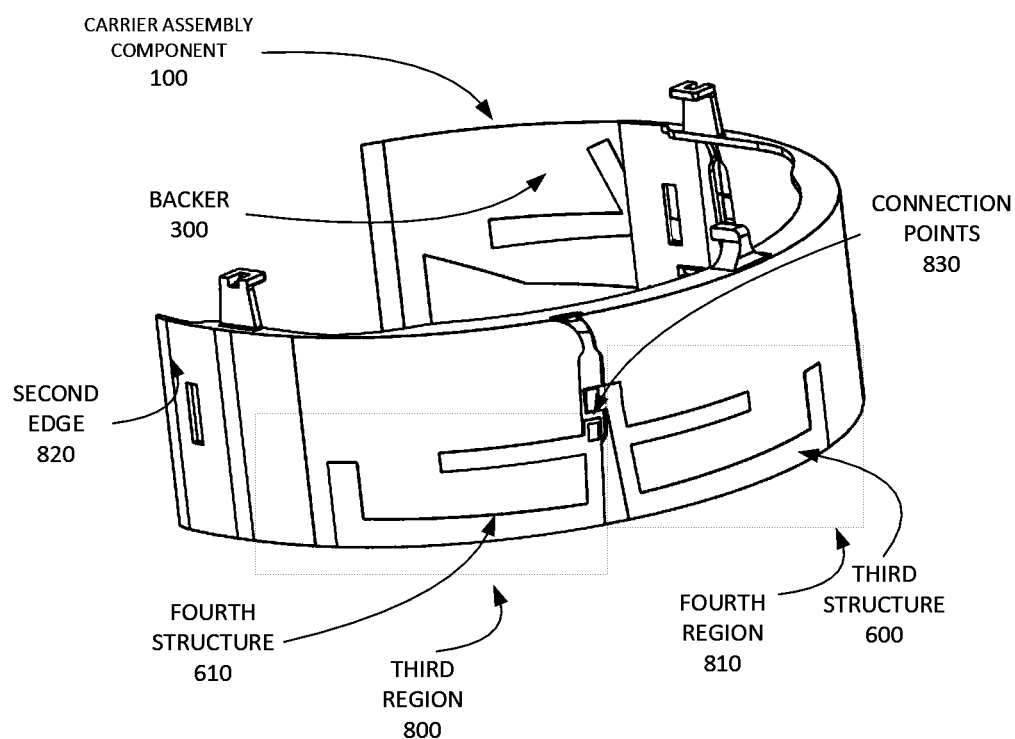
FIG. 8 is a diagram illustrating third and fourth regions of the LTE antenna optimized for North American Electricity meters.

FIG. 8 is a diagram illustrating third and fourth regions of the LTE antenna optimized for North American Electricity meters. In one embodiment, FIG. 8 represents the constructed carrier assembly component 100 from a side view where a third region 800 and a fourth region 810 are visible. In the embodiment of FIG. 8, the fourth structure 610 is in the third region 800 and the third structure 600 is in the fourth region 810. The third and fourth structures 600 and 610 contact a void region at connection points 830. In this example, each of the third and the fourth structures 600 and 610 are shown as having individual connection points 830 that contact the backer 300 via the void region, although other implementations are possible as well. In the current example, the third region 800 is shown as being adjacent and or near to a second edge 820 of the carrier assembly component 100.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A device comprising:
a carrier having first and second asymmetrical voids on a surface;
a backer on a first side of the surface of the carrier;
a first structure on a second side of the carrier, the first structure having a first connection to the backer via the first asymmetrical void, the first structure having a plurality of substantially parallel first horizontal ridges extending away from the first asymmetrical void toward a first edge of the carrier and a plurality of first vertical ridges, at least one of the first vertical ridges being substantially non-parallel;
second structure on the second side of the carrier, the second structure having a second connection to the backer via the first asymmetrical void, the second structure having a plurality of second horizontal ridges extending away from the first asymmetrical void toward a center of the carrier and a plurality of second vertical ridges, at least one of the second vertical ridges being substantially non-parallel;
a third structure on the second side of the carrier, the third structure having a third connection to the backer via the second asymmetrical void, the third structure having a plurality of substantially parallel third horizontal ridges extending away from the second asymmetrical void toward a second edge of the carrier and a plurality of third vertical ridges, wherein at least one of the third vertical ridges has a first separation from one of the substantially parallel third horizontal ridges; and
a fourth structure on the second side of the carrier, the fourth structure having a fourth connection to the backer via the second asymmetrical void, the fourth structure having a plurality of substantially parallel fourth horizontal ridges extending away from the second asymmetrical void toward the center of the carrier and a plurality of fourth vertical ridges, wherein at least one of the fourth vertical ridges has a second separation from one of the substantially parallel fourth horizontal ridges.

2. The device of claim 1 wherein the first asymmetrical void is a first distance from the first edge and the second asymmetrical void is a second distance from the second edge, the first and second distances being different.

3. The device of claim 1 wherein the first and second asymmetrical voids extend to a bottom surface of the carrier and do not extend to a top surface of the carrier.

4. The device of claim 1 wherein the first, second, third, and fourth structures are metal.

5. The device of claim 4 wherein the first, second, third, and fourth structures are radiating elements.

6. The device of claim 1 wherein the at least one of the at least one of the first vertical ridges and the at least one of the second vertical ridges are not parallel to one another.

7. The device of claim 1 wherein the first separation is adjacent to the second edge and the second separation is adjacent to the center.

8. The device of claim 1 wherein the first structure has a first horizontal ridge separated from a first vertical ridge and the second structure has a second horizontal ridge separated from a second vertical ridge.

9. One or more hardware-based non-transitory memory devices storing computer-readable instructions which, when executed by the one or more processors disposed in a computing device, cause the computing device to:
obtain a carrier having first and second asymmetrical voids on a surface;
attach a backer on a first side of the surface of the carrier;
attach a first and a second structure on a second side of the carrier, the first and second structures having a first connection to the backer via the first asymmetrical void, the first structure having a plurality of substantially parallel first horizontal ridges and first and second non-parallel vertical ridges, the second structure having a plurality of substantially parallel second horizontal ridges and third and fourth non-parallel vertical ridges; and
attach a third and a fourth structure on the second side of the carrier, the third and fourth structures having a second connection to the backer via the second asymmetrical void, the third structure having a plurality of substantially parallel third horizontal ridges and a plurality of third vertical ridges, wherein at least one of the third vertical ridges has a first separation from one of the substantially parallel third horizontal ridges, the fourth structure having a plurality of substantially parallel fourth horizontal ridges and a plurality of fourth vertical ridges, wherein at least one of the fourth vertical ridges has a second separation from one of the substantially parallel fourth horizontal ridges.

10. The one or more hardware-based non-transitory memory devices of claim 9 wherein the step of obtaining further comprises positioning the first and second asymmetrical voids in an asymmetrical manner on the surface of the carrier.

11. The one or more hardware-based non-transitory memory devices of claim 9 wherein the first and second asymmetrical voids extend to a bottom surface of the carrier and do not extend to a top surface of the carrier.

12. The one or more hardware-based non-transitory memory devices of claim 9 wherein the first, second, third, and fourth structures are metal.

13. The one or more hardware-based non-transitory memory devices of claim 12, wherein the first, second, third, and fourth structures are radiating elements.

14. The one or more hardware-based non-transitory memory devices of claim 9 wherein the step of attaching a first and a second structure further comprises attaching the first and second structures so that at least one of the at least one of the first vertical ridges and the at least one of the second vertical ridges are not parallel to one another.

15. A electric power meter comprising:
a first antenna module; and
a plurality of second antennas;
wherein the first antenna module includes an isolation component, a carrier assembly component, a radio, and an additional antenna, and wherein the isolation component isolates the carrier assembly component, the radio, and the additional antenna from each other, and
wherein the carrier assembly component comprises a carrier having first and second asymmetrical voids on a surface, a backer on a first side of the surface of the carrier, a first and a second structure on a second side of the carrier, the first and second structures having a first connection to the backer via the first asymmetrical void, and a third and a fourth structure on the second side of the carrier, the third and fourth structures having a second connection to the backer via the second asymmetrical void,
the first structure having a plurality of substantially parallel first horizontal ridges and first and second non-parallel vertical ridges, the second structure having a plurality of substantially parallel second horizontal ridges and third and fourth non-parallel vertical ridges, the third structure having a plurality of substantially parallel third horizontal ridges and a plurality of third vertical ridges, wherein at least one of the third vertical ridges has a first separation from one of the substantially parallel third horizontal ridges, the fourth structure having a plurality of substantially parallel fourth horizontal ridges and a plurality of fourth vertical ridges, wherein at least one of the fourth vertical ridges has a second separation from one of the substantially parallel fourth horizontal ridges.

16. The electric power meter of claim 15 wherein the first asymmetrical void is a first distance from a first edge of the carrier and the second asymmetrical void is a second distance from a second edge of the carrier, the first and second distances being different.

17. The electric power meter of claim 15 wherein the first and second asymmetrical voids extend to a bottom surface of the carrier and do not extend to a top surface of the carrier.

18. The electric power meter of claim 15 wherein the first, second, third, and fourth structures are metal.

19. The electric power meter of claim 15 wherein the first, second, third, and fourth structures are radiating elements.

20. The electric power meter of claim 15 wherein the first structure has a first vertical ridge and the second structure has a second vertical ridge, the first and second vertical ridges being non-parallel.

* * * * *